US 10,504,219 B2

(12) United States Patent
Tsuchiya et al.

(10) Patent No.: US 10,504,219 B2
(45) Date of Patent: *Dec. 10, 2019

(54) INSPECTION APPARATUS AND INSPECTION METHOD

(71) Applicant: NuFlare Technology, Inc., Yokohama-shi (JP)

(72) Inventors: Hideo Tsuchiya, Setagaya-ku (JP); Nobutaka Kikuiri, Koganei (JP)

(73) Assignee: NuFlare Technology, Inc., Yokohama-shi (JP)

( * ) Notice: Subject to any disclaimer, the term of this patent is extended or adjusted under 35 U.S.C. 154(b) by 188 days.

This patent is subject to a terminal disclaimer.

(21) Appl. No.: 14/987,951

(22) Filed: Jan. 5, 2016

(65) Prior Publication Data

US 2016/0203595 A1 Jul. 14, 2016

(30) Foreign Application Priority Data

Jan. 8, 2015 (JP) .................................. 2015-002623

(51) Int. Cl.
*G06T 7/00* (2017.01)
*G06K 9/62* (2006.01)
(Continued)

(52) U.S. Cl.
CPC .......... *G06T 7/0004* (2013.01); *G01R 31/311* (2013.01); *G03F 1/84* (2013.01);
(Continued)

(58) Field of Classification Search
CPC .......... G03F 1/72–74; G01N 21/95607; G06T 7/001
See application file for complete search history.

(56) References Cited

U.S. PATENT DOCUMENTS

| 6,335,129 | B1 * | 1/2002 | Asano | ....................... | G03F 1/74 |
| | | | | | 430/5 |
| 2006/0051681 | A1 * | 3/2006 | Taylor | ....................... | G03F 1/72 |
| | | | | | 430/5 |

(Continued)

FOREIGN PATENT DOCUMENTS

| JP | 2004-356330 | 12/2004 |
| JP | 2008-26822 A | 2/2008 |

(Continued)

OTHER PUBLICATIONS

Broadbent, William, et al. "Field results from a new die-to-database reticle inspection platform." Proc. of SPIE vol. vol. 6607. 2007.*

(Continued)

*Primary Examiner* — Vincent Rudolph
*Assistant Examiner* — Raphael Schwartz
(74) *Attorney, Agent, or Firm* — Oblon, McClelland, Maier & Neustadt, L.L.P.

(57) ABSTRACT

An inspection apparatus includes a lighting unit, an imaging unit, an optical image comparison unit, a map creation unit, a map storage unit, a first storage unit, a map comparison unit, and a first determination unit. The lighting unit irradiates a sample including a defect to be inspected with a lighting light. The imaging unit obtains either or both of a first optical image formed by the lighting light transmitted through the sample to be inspected and a second optical image formed by the lighting light reflected by the sample to be inspected and obtains either or both of a third optical image formed by the lighting light transmitted through the sample to be inspected and having a corrected defect and a fourth optical image formed by the lighting light reflected by the sample to be inspected and having a corrected defect. The optical image comparison unit performs either or both of a first comparison between a first reference image referenced from an optical image formed by the lighting light transmitted through the sample to be inspected and the first optical image and a second comparison between a second reference image referenced from an optical image formed by the lighting light reflected by the sample to be inspected and the second optical image and performs either or both of a third comparison between the first reference image and the third optical image and a fourth comparison between the second reference image and the fourth optical image. The map creation unit creates either or both of a first map of the sample to be inspected based on the first comparison and a second map of the sample to be inspected based on the second comparison and creates either or both of a third map of the sample to be inspected based on the third comparison and a fourth map of the sample to be inspected based on the fourth comparison. The map storage unit stores either or (Continued)

both of the first map and the second map. The first storage unit stores defect correction method information on the defect. The map comparison unit performs either or both of a fifth comparison between the first map and the third map based on the defect correction method information and a sixth comparison between the second map and the fourth map based on the defect correction method information. The first determination unit determines, based on the defect correction method information and either or both of the fifth comparison and the sixth comparison, whether the correction is appropriate.

10 Claims, 8 Drawing Sheets

(51) Int. Cl.
*G03F 1/84* (2012.01)
*G01R 31/311* (2006.01)
*H04N 5/225* (2006.01)

(52) U.S. Cl.
CPC .......... *G06K 9/6201* (2013.01); *G06T 7/0006* (2013.01); *G06T 2207/10016* (2013.01); *G06T 2207/30148* (2013.01); *H04N 5/2256* (2013.01)

(56) References Cited

U.S. PATENT DOCUMENTS

| | | | |
|---|---|---|---|
| 2008/0318138 A1* | 12/2008 | Holfeld | B82Y 10/00 430/5 |
| 2012/0009511 A1 | 1/2012 | Dmitriev | |
| 2016/0171674 A1 | 6/2016 | Tsuchiya et al. | |

FOREIGN PATENT DOCUMENTS

| | | | |
|---|---|---|---|
| JP | 2009020277 A | * | 1/2009 |
| JP | 2012-21959 A | | 2/2012 |
| JP | 2012-22323 | | 2/2012 |
| JP | 2016-114460 A | | 6/2016 |

OTHER PUBLICATIONS

U.S. Appl. No. 14/953,993, filed Nov. 30, 2015, Hideo Tsuchiya et al.
Japanese Office Action dated Aug. 28, 2018 in Patent Application No. 2015-002623 (with English translation), 5 pages.
Japanese Office Action dated Jan. 8, 2019 in Japanese Application No. 2015-002623 (with English transiation), 6 pages.

* cited by examiner

BEFORE CORRECTION

BEFORE CORRECTION

AFTER CORRECTION

AFTER CORRECTION

INSPECTION APPARATUS AND INSPECTION METHOD

CROSS-REFERENCE TO RELATED APPLICATION

This application is based upon and claims the benefit of priority from Japanese Patent Applications No. 2015-002623, filed on Jan. 8, 2015, the entire contents of which are incorporated herein by reference.

FIELD OF THE INVENTION

Embodiments described herein relate generally to an inspection apparatus and an inspection method. For example, the embodiments relate to an inspection apparatus and an inspection method for inspecting a pattern by obtaining an optical image of a pattern image by irradiating a sample to be inspected, such as a mask used to manufacture a semiconductor device, with a laser light.

BACKGROUND OF THE INVENTION

Accuracy control of a circuit line width required in a semiconductor device is increasingly required in recent years. Such a semiconductor device is manufactured by forming a circuit by exposing and transferring a pattern on a wafer by a reduced-projection exposure apparatus called a stepper by using an original pattern (called a photolithography mask or a reticle, and hereinafter collectively called a mask) in which a circuit pattern is formed. Therefore, a mask for transferring a fine circuit pattern on a wafer is manufactured by using a pattern drawing apparatus using an electron beam. The pattern drawing apparatus can draw a fine circuit pattern. The pattern circuit apparatus can directly draw a pattern circuit on a wafer.

Improvement of yield is essential in manufacturing of LSI, such as a central processing unit (CPU) and a field programmable gate array (FPGA), requiring a high manufacturing cost. One of significant factors to reduce yield is a pattern defect of a mask used to expose and transfer an ultra fine pattern on a semiconductor wafer by a photolithography technique. In recent years, as the size of an LSI pattern formed on a semiconductor wafer is miniaturized, a size to be detected as a pattern defect is significantly reduced. Therefore, a highly accurate pattern inspection apparatus to inspect a defect of a transfer mask used in LSI manufacturing is desirable.

An inspection method is known in which an optical image, in which a pattern formed on a sample of such as a photolithography mask is imaged at a predetermined magnification by using an expansion optical system is compared with design data or an optical image, in which the same pattern on the sample is imaged. Examples of a pattern inspection method include a "die-to-die inspection" and a "die-to-database inspection". In the die-to-die inspection, data of optical images, in which the same patterns at different locations on the same mask are imaged, are compared each other. In the die-to-database inspection, drawing data (pattern data), in which pattern-designed CAD data is converted into an apparatus input format to be input by a drawing apparatus when a pattern is drawn to a mask, is input to an inspection apparatus, design image data (a reference image) is generated based on the drawing data, and the design image data and an optical image formed by the pattern and being measurement data are compared. In an inspection method in such an inspection apparatus, a sample is disposed on a stage and inspected by which a beam scans on the sample when the stage is moved. The sample is irradiated with the beam by a light source and a lighting optical system. A light transmitted through or reflected by the sample is imaged on a light detector via the optical system. An image formed by the light detector is sent to a comparison circuit as measurement data. In the comparison circuit, after images are positioned each other, measurement data and reference data are compared in accordance with an appropriate algorithm. In the case of nonconformity, it is determined that there is a defective pattern.

While a pattern is miniaturized, by using a mask as an original pattern, a lithography technique in which a circuit is formed by exposing and transferring a pattern on a wafer by a reduced-projection exposure apparatus is continuously used. Therefore, it becomes difficult to secure an allowable range with respect to a pattern defect of a mask and a variation allowable range (margin) of process conditions during exposure transfer to improve a manufacturing yield of a wafer. Conventionally, variation margins in the process conditions are absorbed mainly by strictly setting an allowable value of a form defect and increasing dimensional accuracy of a mask pattern form. However, in addition to that each figure included in a pattern is formed according to a designed size, high position accuracy of a pattern on a mask and line width dimensional accuracy of the pattern are required to the quality of a mask to be inspected.

Further, a defect correction method for a defect determined by a pattern inspection is diversified. Conventionally, the following methods are used as a correction method: a method in which a pattern is removed by spattering by a focused ion beam (FIB); a method in which a metal film is deposited by a laser chemical vapor deposition (laser CVD); and a method in which an amorphous carbon film is deposited as a pattern by the FIB or an electron beam. The Japanese Patent application Publication No. 2012-022323 discloses a method for correcting a transfer image of a photolithography mask by changing, by femtosecond laser pulse, a transmittance of a substrate including a pattern of the photolithography mask.

Therefore, an inspection apparatus and an inspection method are required which can highly accurately inspect a mask in which a defect has been corrected such that position accuracy and line width dimensional accuracy of the pattern of a photolithography mask are improved.

SUMMARY OF THE INVENTION

An inspection apparatus according to embodiments includes a lighting source, an imager, an optical image comparison circuit, a map creation circuit, a map storage memory, a first storage memory, a map comparison circuit, and a first determination circuit. The lighting source irradiates a sample including a defect to be inspected with a lighting light. The imager obtains either or both of a first optical image formed by the lighting light transmitted through the sample to be inspected and a second optical image formed by the lighting light reflected by the sample to be inspected and obtains either or both of a third optical image formed by the lighting light transmitted through the sample to be inspected and having a corrected defect and a fourth optical image formed by the lighting light reflected by the sample to be inspected and having a corrected defect. The optical image comparison circuit performs either or both of a first comparison between a first reference image referenced from an optical image formed by the lighting light transmitted through the sample to be inspected and the first optical image and a second comparison between a second reference image referenced from an optical image formed by the lighting light reflected by the sample to be inspected and the second optical image and performs either or both of a third comparison between the first reference image and the third optical image and a fourth comparison between the second reference image and the fourth optical image. The map creation circuit creates either or both of a first map of the sample to be inspected based on the first comparison and a second map of the sample to be inspected based on the second comparison and creates either or both of a third map of the sample to be inspected based on the third comparison and a fourth map of the sample to be inspected based on the fourth comparison. The map storage circuit stores either or both of the first map and the second map. The first storage memory stores defect correction method information on the defect. The map comparison circuit performs either or both of a fifth comparison between the first map and the third map based on the defect correction method information and a sixth comparison between the second map and the fourth map based on the defect correction method information. The first determination circuit determines, based on the defect correction method information and either or both of the fifth comparison and the sixth comparison, whether the correction is appropriate.

An inspection method according to embodiments includes: irradiating a sample including a defect to be inspected with a lighting light; obtaining either or both of a first optical image formed by the lighting light transmitted through the sample to be inspected and a second optical image formed by the lighting light reflected by the sample to be inspected; performing either or both of a first comparison between a first reference image referenced from an optical image formed by the lighting light transmitted through the sample to be inspected and the first optical image and a second comparison between a second reference image referenced from an optical image formed by the lighting light reflected by the sample to be inspected and the second optical image; creating either or both of a first map of the sample to be inspected based on the first comparison and a second map of the sample to be inspected based on the second comparison; storing either or both of the first map and the second map; determining necessity of the defect correction of the defect; determining a defect correction method for the defect; storing defect correction method information on the defect; correcting the defect by using the defect correction method; irradiating the sample to be inspected with a lighting light; obtaining either or both of a third optical image formed by the lighting light transmitted through the sample to be inspected and a fourth optical image formed by the lighting light reflected by the sample to be inspected; performing either or both of a third comparison between the first reference image and the third optical image and a fourth comparison between the second reference image and the fourth optical image; creating either or both of a third map of the sample to be inspected based on the third comparison and a fourth map of the sample to be inspected based on the fourth comparison; performing either or both of a fifth comparison between the first map and the third map based on the defect correction method information and a sixth comparison between the second map and the fourth map based on the defect correction method information; and determining whether the correction is appropriate, based on either or both of a result of the fifth comparison and a result of the sixth comparison and the defect correction method information.

DETAILED DESCRIPTION OF THE EMBODIMENTS

Figure 1:
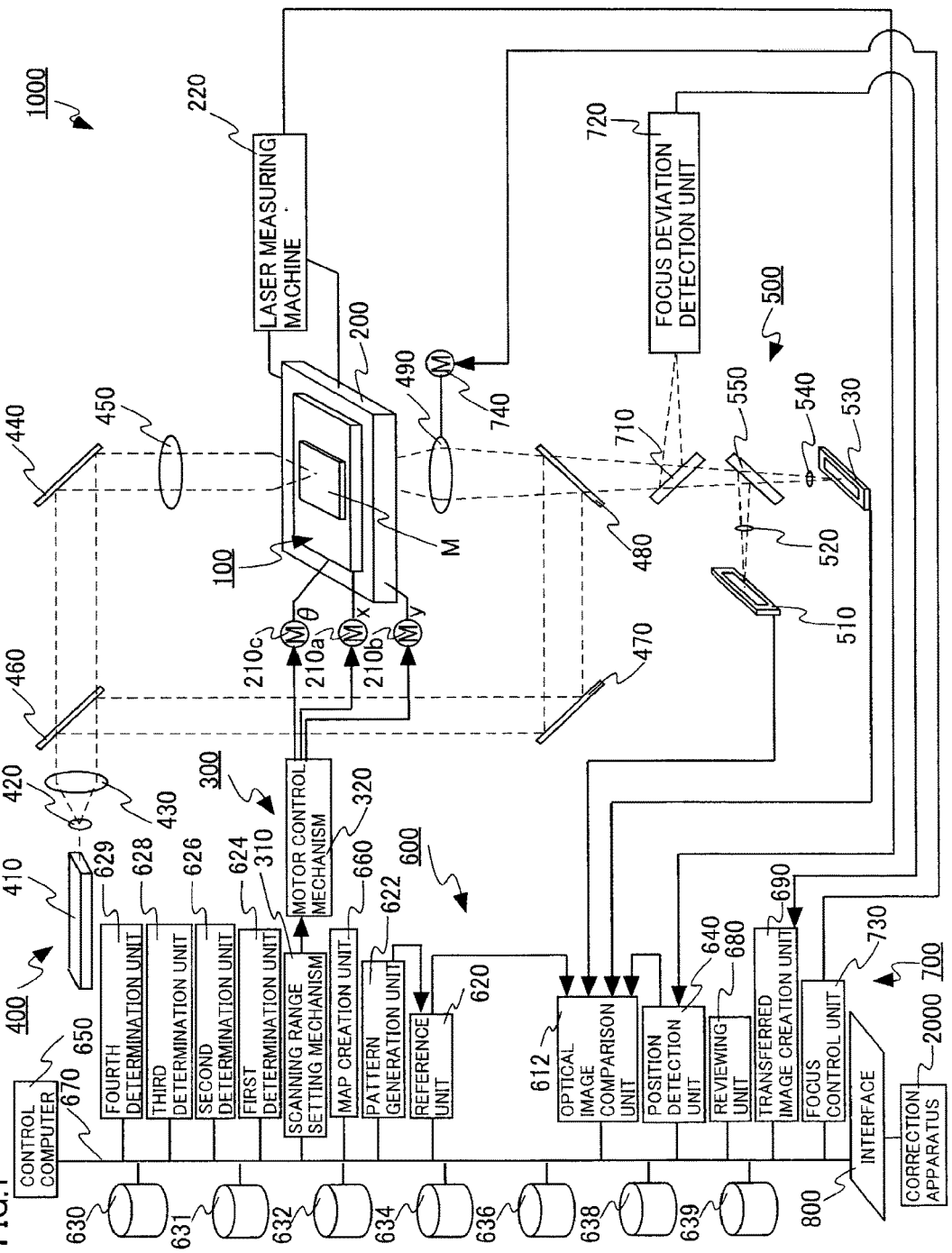
FIG. 1 is a schematic view of a main portion of an inspection apparatus according to a first embodiment.

Embodiments will be described below with reference to the drawings.

Hereinafter, a photolithography mask (a sample to be inspected) will be simply called a mask.

First Embodiment

An inspection apparatus according to a first embodiment includes a lighting unit, an imaging unit, an optical image comparison unit, a map creation unit, a map storage unit, a first storage unit, a map comparison unit, and a first determination unit. The lighting unit irradiates a sample including a defect to be inspected with a lighting light. The imaging unit obtains either or both of a first optical image formed by the lighting light transmitted through the sample to be inspected and a second optical image formed by the lighting light reflected by the sample to be inspected and obtains either or both of a third optical image formed by the lighting light transmitted through the sample to be inspected and having a corrected defect and a fourth optical image formed by the lighting light reflected by the sample to be inspected and having a corrected defect. The optical image comparison unit performs either or both of a first comparison between a first reference image referenced from an optical image formed by the lighting light transmitted through the sample to be inspected and the first optical image and a second comparison between a second reference image referenced from an optical image formed by the lighting light reflected by the sample to be inspected and the second optical image and performs either or both of a third comparison between the first reference image and the third optical image and a fourth comparison between the second reference image and the fourth optical image. The map creation unit creates either or both of a first map of the sample to be inspected based on the first comparison and a second map of the sample to be inspected based on the second comparison and creates either or both of a third map of the sample to be inspected based on the third comparison and a fourth map of the sample to be inspected based on the fourth comparison. The map storage unit stores either or both of the first map and the second map. The first storage unit stores defect correction method information on the defect. The map comparison unit performs either or both of a fifth comparison between the first map and the third map based on the defect correction method information and a sixth comparison between the second map and the fourth map based on the defect correction method information. The first determination unit determines, based on the defect correction method information and either or both of the fifth comparison and the sixth comparison, whether the correction is appropriate.

An inspection method according to the first embodiment includes: irradiating a sample including a defect to be inspected with a lighting light; obtaining either or both of a first optical image formed by the lighting light transmitted through the sample to be inspected and a second optical image formed by the lighting light reflected by the sample to be inspected; performing either or both of a first comparison between a first reference image referenced from an optical image formed by the lighting light transmitted through the sample to be inspected and the first optical image and a second comparison between a second reference image referenced from an optical image formed by the lighting light reflected by the sample to be inspected and the second optical image; creating either or both of a first map of the sample to be inspected based on the first comparison and a second map of the sample to be inspected based on the second comparison; storing either or both of the first map and the second map; determining necessity of the defect correction of the defect; determining a defect correction method for the defect; storing defect correction method information on the defect; correcting the defect by using the defect correction method; irradiating the sample to be inspected with a lighting light; obtaining either or both of a third optical image formed by the lighting light transmitted through the sample to be inspected and a fourth optical image formed by the lighting light reflected by the sample to be inspected; performing either or both of a third comparison between the first reference image and the third optical image and a fourth comparison between the second reference image and the fourth optical image; creating either or both of a third map of the sample to be inspected based on the third comparison and a fourth map of the sample to be inspected based on the fourth comparison; performing either or both of a fifth comparison between the first map and the third map based on the defect correction method information and a sixth comparison between the second map and the fourth map based on the defect correction method information; and determining whether the correction is appropriate, based on either or both of a result of the fifth comparison and a result of the sixth comparison and the defect correction method information.

FIG. 1 is a schematic view of an inspection apparatus 1000 according to the first embodiment. The inspection apparatus according to the embodiment is a pattern inspection apparatus to inspect a defect in a mask.

A mask M is arranged in a storage 100.

A stage 200 is disposed under the storage 100 and supports the storage 100. The stage 200 is moved in an X direction and a Y direction, which are mutually orthogonal horizontal directions, by a first motor 210a and a second motor 210b. Further, the stage 200 is rotated by a third motor 210c on a surface perpendicular in a vertical direction. A laser measuring machine 220 measures positions of the stage 200 in the X direction and in the Y direction.

A moving control unit 300 includes a scanning range setting mechanism 310 and a motor control mechanism 320. The scanning range setting mechanism 310 is connected to a control computer 650 to be described later via a bus line 670. The motor control mechanism 320 controls the first motor 210a, the second motor 210b, and the third motor 210c such that the stage 200 is moved within a scanning range set by the scanning range setting mechanism 310.

A lighting unit 400 includes a light source 410, a lens 420 for a first lighting unit, a lens 430 for a second lighting unit, a mirror 440 for the first lighting unit, a condenser lens 450, a beam distribution device 460 for the first lighting unit, and a mirror 470 for the second lighting unit, a beam distribution device 480 for the second lighting unit, and an objective lens 490.

A lighting light such as a laser light emitted from the light source 410 is expanded so as to become a parallel beam by the lens 420 for the first lighting unit and the lens 430 for the second lighting unit. The mirror 440 for the first lighting unit and the condenser lens 450 irradiate a glass surface of the mask M with the expanded beam. The lens 420 for the first lighting unit, the lens 430 for the second lighting unit, the mirror 440 for the first lighting unit, and the condenser lens 450 form a light transmitting system. A wavelength of the light source 410 is preferably similar to a wavelength of a light source included in an exposure apparatus in which the mask M is used, since the mask M can be inspected in a state similar to the state of exposing by using the mask M.

Further, a lighting light such as a laser light emitted from the light source 410 is reflected by the beam distribution device 460 for the first lighting unit disposed between the lens 430 for the second lighting unit and the mirror 440 for the first lighting unit after the lighting light is expanded so as to become a parallel beam by the lens 420 for the first lighting unit and the lens 430 for the second lighting unit. The mirror 470 for the second lighting unit and the beam distribution device 480 for the second lighting unit irradiate a film surface of the mask M with the lighting light reflected by the beam distribution device 460 for the first lighting unit. A reflection lighting system includes the beam distribution device 460 for the first lighting unit, the mirror 470 for the second lighting unit, and the beam distribution device 480 for the second lighting unit. Specifically, a half mirror, a slit, and a polarization beam splitter are preferably used as the beam distribution device 460 for the first lighting unit and the beam distribution device 480 for the second lighting unit.

An imaging unit 500 includes a first light detector 510, a lens 520 for a first imaging unit, a second light detector 530, a lens 540 for a second imaging unit, and a separation mirror 550.

A lighting light with which a glass surface of the mask M is irradiated by the light transmitting system and which is transmitted through the mask M is called a transmitted light. A lighting light with which a film surface of the mask M is irradiated by the reflection lighting system and which is then reflected by the mask M is called a reflected light. The transmitted light and the reflected light enter the separation mirror 550 through the objective lens 490 and the beam distribution device 480 for the second lighting unit. The transmitted light is imaged by the first light detector 510 through the lens 520 for the first imaging unit from the separation mirror 550. The reflected light is imaged by the second light detector 530 through the lens 540 for the second imaging unit from the separation mirror 550.

A control circuit 600 includes an optical image comparison unit 612, a map comparison unit 614, a reference unit 620, a pattern generation unit 622, a first determination unit (determination unit) 624, a second determination unit 626, a third determination unit 628, a fourth determination unit 629, a pattern data storage unit 630, a map storage unit 631, a first storage unit 632, a second storage unit 634, a third storage unit 636, a fourth storage unit 638, a fifth storage unit 639, a position detection unit 640, the control computer 650, a map creation unit 660, the bus line 670, a reviewing unit 680, and a transfer image creation unit 690.

Figure 2A:
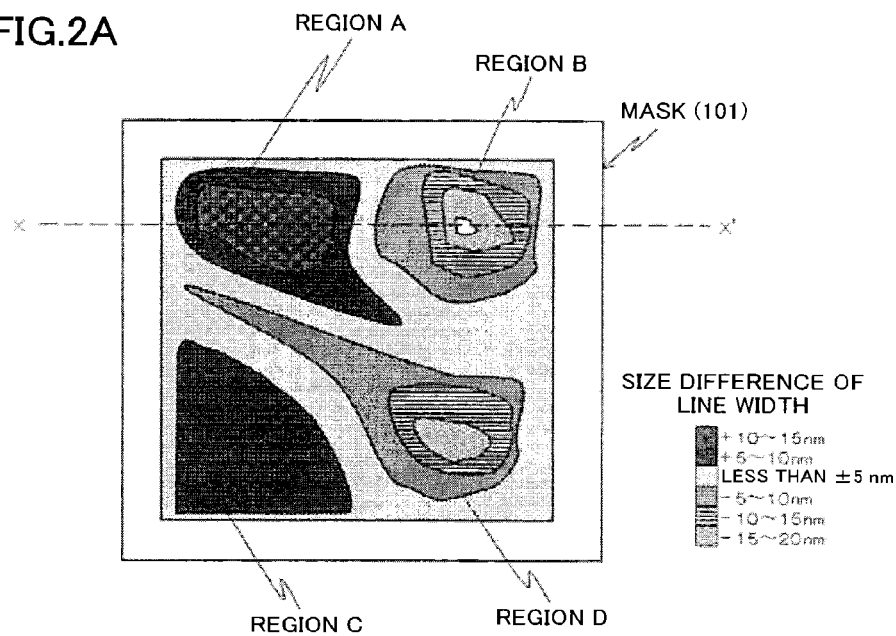
FIGS. 2A and 2B are schematic views illustrating examples of a line width error map and a position deviation map according to the first embodiment.
Figure 2B:
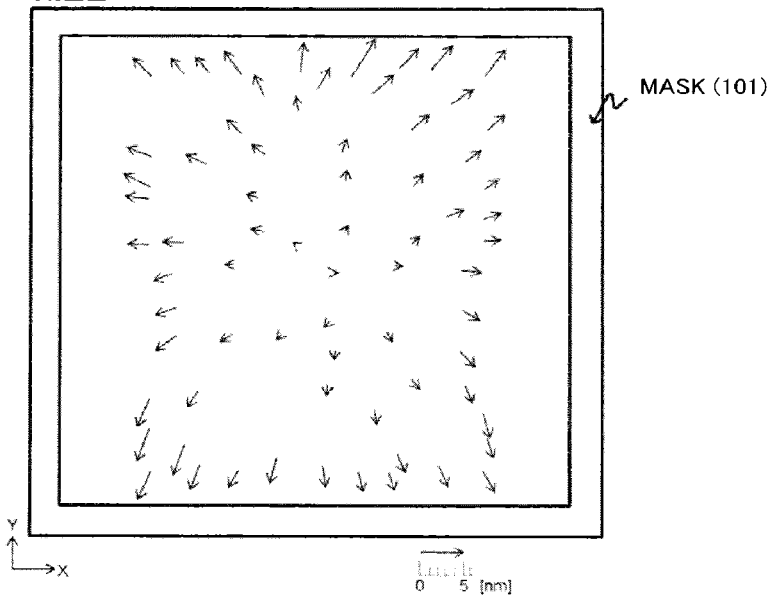

The map creation unit 660 creates a defect map of the mask M. Herein, examples of a defect of the mask M include a state in which a roughness level of a pattern edge of the mask M exceeds an allowable level, a case where a pattern line width error (CD error) of the mask M exceeds an allowable size, and a ratio with respect to line width exceeds an allowable level, and a case where position deviation of the pattern of the mask M exceeds an allowable size, and a dimensional error with respect to the line width exceeds a predetermined allowable ratio. Further, examples of the defect map of the mask M include a position deviation map of a pattern of the mask M (a registration map, abbreviated as a Reg map) and a line width error map (abbreviated as a CD map) of the mask M. FIGS. 2A and 2B are schematic views illustrating examples of a line width error map and a position deviation map according to the embodiment. FIG. 2A is a schematic view illustrating an example of a line width error map. FIG. 2B is a schematic view illustrating an example of a position deviation map.

An auto focus unit 700 includes an auto focus beam distribution device 710, a focus deviation detection unit 720, a focus control unit 730, and a motor 740 for the auto focus unit.

The reflected light is entered into the focus deviation detection unit 720 by the auto focus beam distribution device 710. The focus deviation detection unit 720 detects a focus deviation level from the incident reflected light and inputs the focus deviation level to the focus control unit 730. The focus control unit 730 moves the objective lens 490 in a height direction by controlling the motor 740 for the auto focus unit based on the input focus deviation level, and the objective lens 490 is focused on the mask M. The stage 200 may be moved in a vertical direction. Specifically, a half mirror, a slit, and a polarization beam splitter are preferably used as the auto focus beam distribution device 710.

As a method for inspecting the mask M, for example, an X axis direction is set to a main scanning direction, and a Y axis direction is set to a sub scanning direction. A lighting light is scanned in the X axis direction by movement of the stage 200 in the X axis direction. A scanning position is moved at a predetermined pitch in the Y axis direction by movement of the stage 200 in the Y axis direction. However, a method for inspecting the mask M is not limited to the above-described method.

Figure 3A:
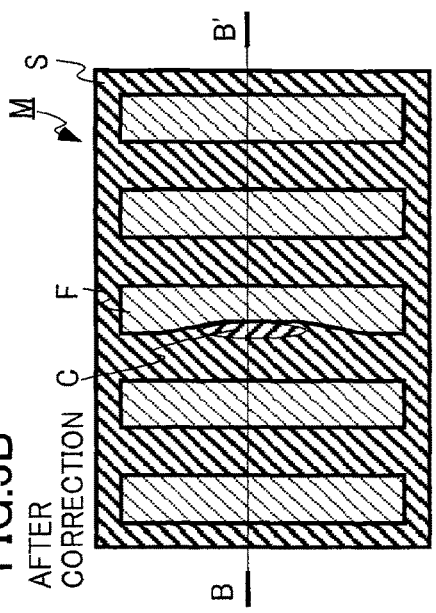
FIGS. 3A to 3D are schematic views illustrating a cross section of an optical image formed by a lighting light transmitted through a mask corrected to reduce a transmittance of a substrate according to the first embodiment.
Figure 3C:
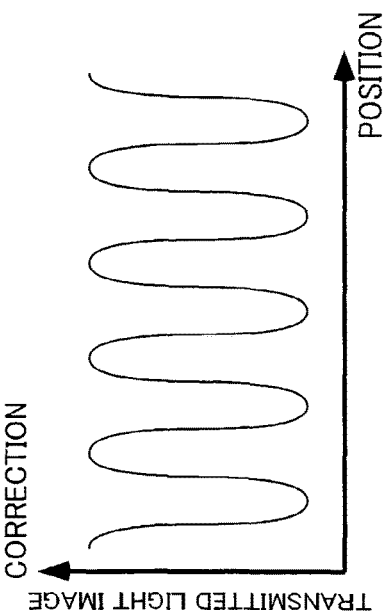
Figure 3B:
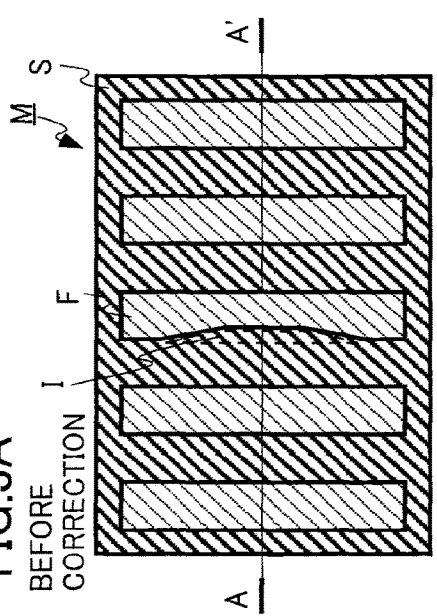
Figure 3D:
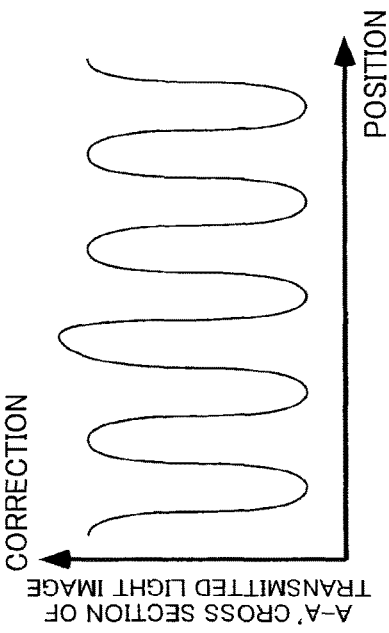

FIGS. 3A to 3D are schematic views illustrating a cross section of an optical image formed by a lighting light transmitted through the mask M corrected to reduce a transmittance of a substrate S according to the embodiment. The substrate S includes quarts. A shielding film F includes a thin film of metal such as chrome. The shielding film F forms a pattern. FIG. 3A illustrates a defective mask M. FIG. 3B illustrates the mask M having a corrected defect. FIG. 3C is a transmitted light image on an A-A' cross section of the defective mask M. FIG. 3D illustrates a transmitted light image on a B-B' cross section of the mask M having a corrected defect. The shielding film F illustrated at a center of FIG. 3A has a white defect I as a defect, and a part of the shielding film F is missed. In a portion in which the white defect is arranged, an amount of the transmitted light increases as illustrated in FIG. 3C, in comparison with a portion in which another shielding film F is disposed.

The mask M illustrated in FIG. 3B includes a portion C in which a transmittance of a substrate is reduced by melting the substrate around the white defect I by femtosecond laser pulse. Therefore, in FIG. 3D, an amount of the transmitted light is equalized on the periphery of a portion in which the central shielding film is disposed and on the periphery of a portion in which another shielding film is disposed. In this manner, a defect can be corrected. For example, a defect can be corrected so as to increase a transmittance by thinning a film thickness of the substrate S.

Figure 4:
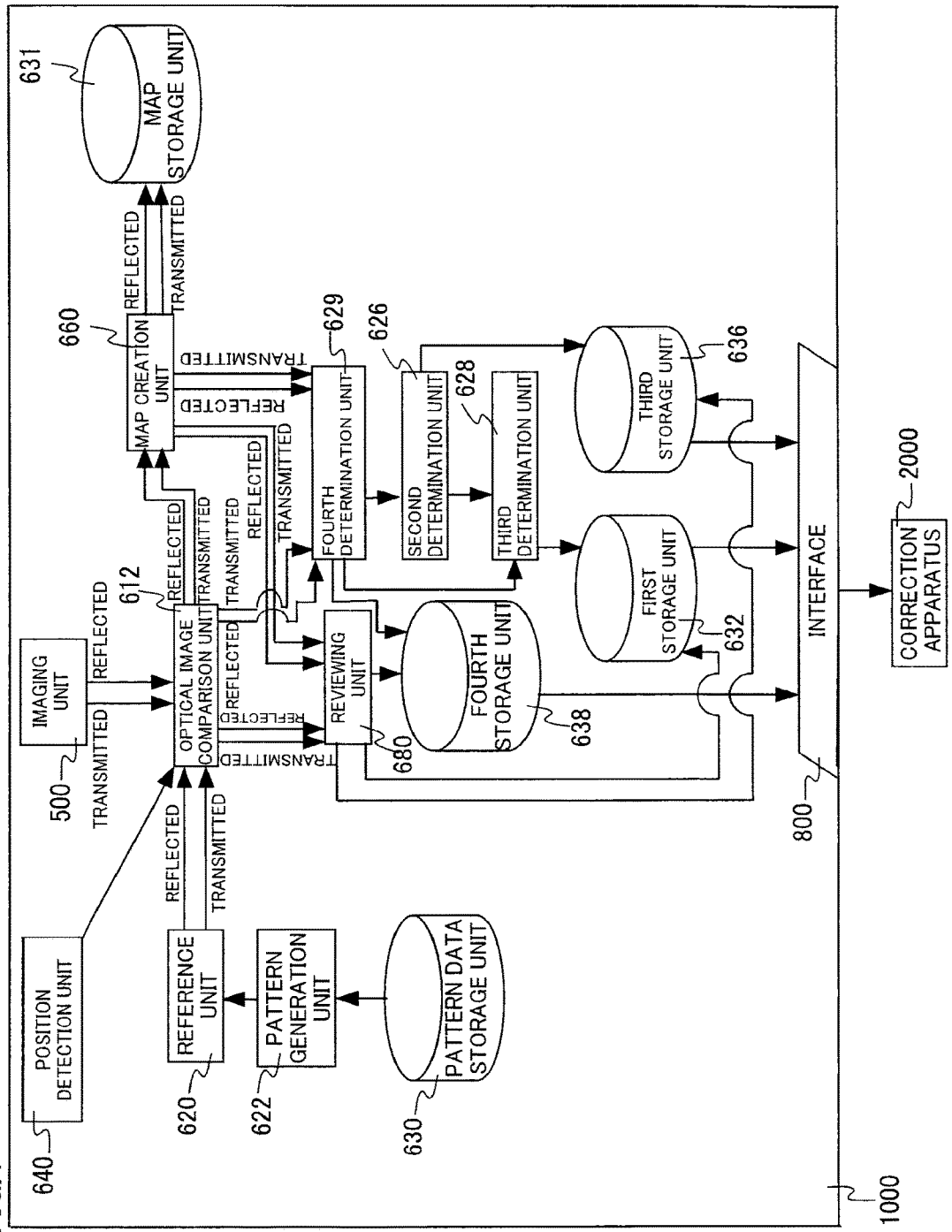
FIG. 4 is a schematic view of a main portion of an apparatus for inspecting a defective mask according to the first embodiment.
Figure 5:
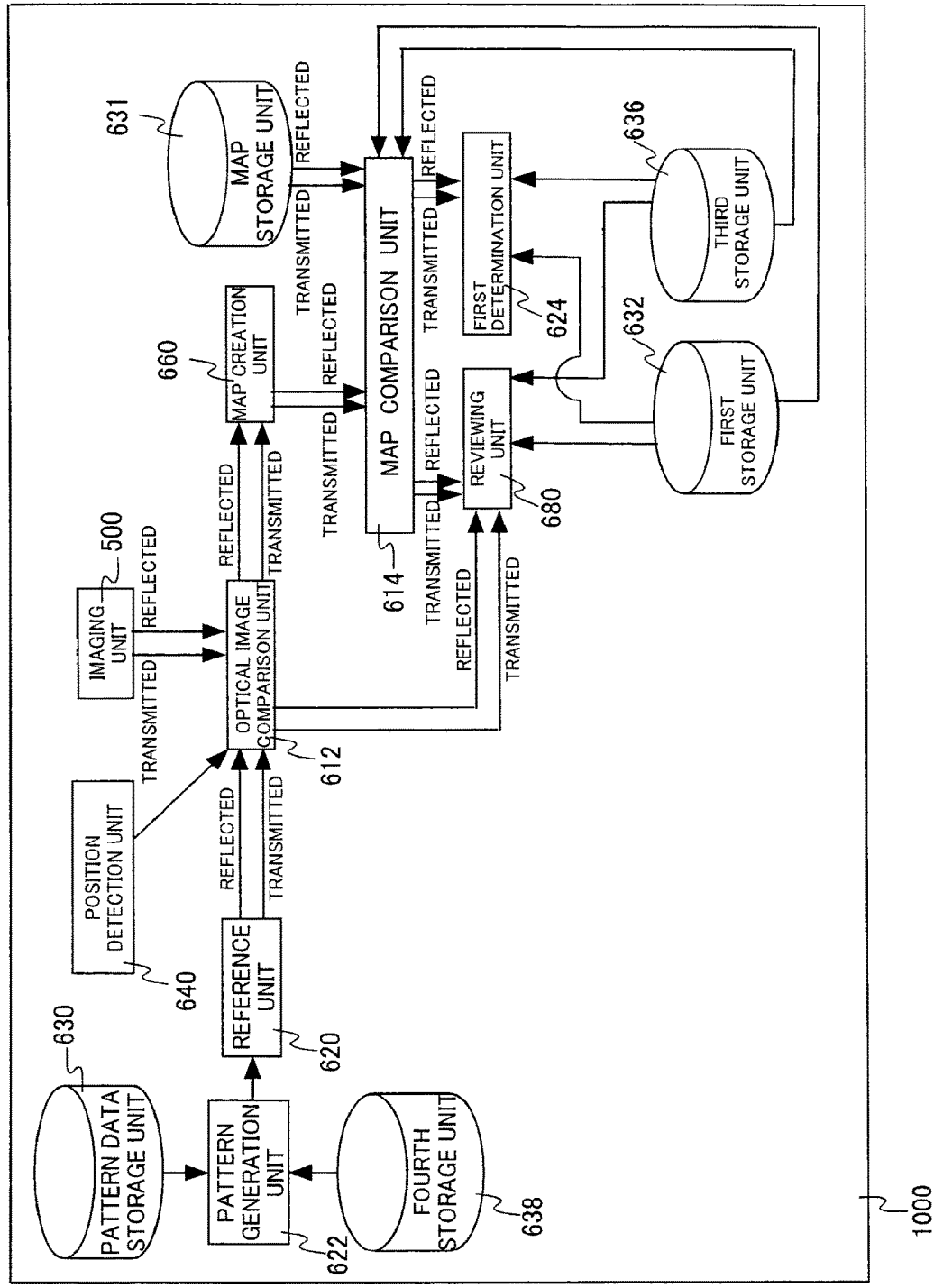
FIG. 5 is a schematic view of a main portion of an apparatus for inspecting a mask having a corrected defect according to the first embodiment.
Figure 6:
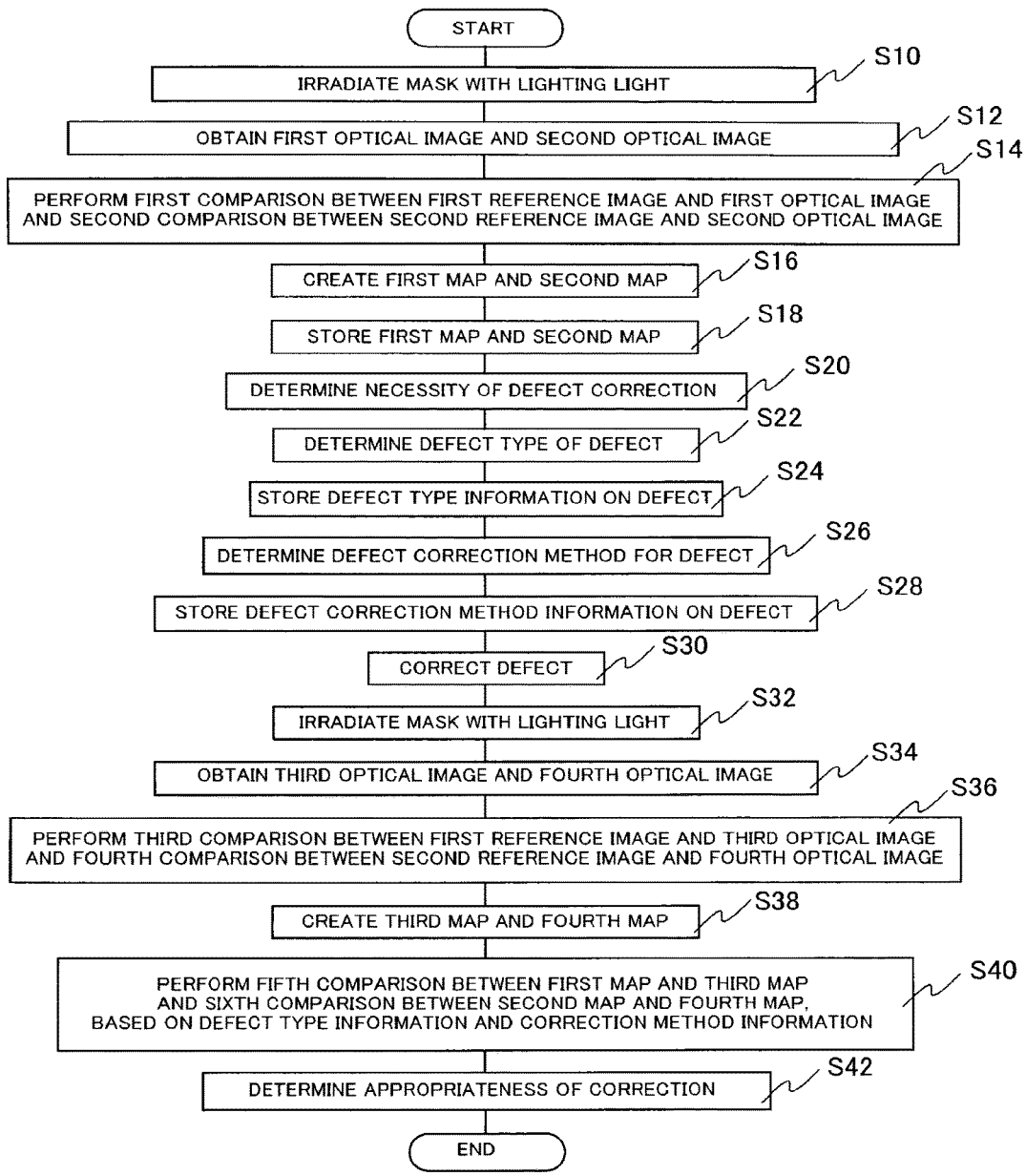
FIG. 6 is a flowchart of a method for inspecting a mask according to the first embodiment.

FIG. 4 is a schematic view of a main portion of an apparatus for inspecting a defective mask M according to the embodiment. FIG. 5 is a schematic view of a main portion of an apparatus for inspecting a mask M having a corrected defect according to the embodiment. FIG. 6 is a flowchart of a method for inspecting the mask M according to the present embodiment.

First, the control computer 650 irradiates the defective mask M with a lighting light by using the lighting unit 400 (S10). Then, a first optical image formed by the lighting light transmitted through the mask M and a second optical image formed by the lighting light reflected by the mask M are obtained by using the imaging unit 500 (S12). Either of the first optical image or the second optical image may be obtained. The obtained first and second optical images are sent to the optical image comparison unit 612.

Next, the control computer 650 inputs pattern data stored in the pattern data storage unit 630 to the pattern generation unit 622, and the pattern data is expanded to each layer. The pattern data is preliminarily created by a designer. Herein, the pattern data is generally not designed such that an inspection apparatus 1000 can directly read the data. Therefore, the pattern data is first converted into intermediate data created for each layer, and then converted into data formed so as to be directly read by each inspection apparatus 1000. After that, the pattern data is input to the pattern generation unit 622.

Next, by using the reference unit 620, the control computer 650 creates either or both of a first reference image and a second reference image from the pattern data expanded to each layer by the pattern generation unit 622. The first reference image is referenced from an optical image formed by a lighting light transmitted through the mask M. The second reference image is referenced from an optical image formed by a lighting light reflected by the mask M.

Next, by using the second optical image comparison unit 612, the control computer 650 performs a first comparison between the first reference image and the first optical image and performs a second comparison between the second reference image and the second optical image (S14). The comparison may be either of the first comparison or the second comparison. An example of the first comparison herein includes a method for comparing an amount of the transmitted light in a pattern portion of the first optical image and an amount of the transmitted light in a pattern portion of the corresponding first reference image. An example of the second comparison herein includes a method for comparing an amount of the reflected light in a pattern portion of the second optical image and an amount of the reflected light in a pattern portion of the corresponding second reference image.

Either or both of the first optical image and the first reference image and the second optical image and the second reference image, and results of the first comparison and the second comparison, are sent to the reviewing unit 680 and reviewed by an operator. Herein, "reviewing" means an operation in which an operator reconfirms a defect portion detected by the inspection apparatus by visually recognizing an optical image and a reference image. Either or both of the first optical image and the first reference image and the second optical image and the second reference image, and results of the first comparison and the second comparison, are sent to the map creation unit 660 and the fourth determination unit 629.

Coordinates of a pattern region in which a comparison process is executed at the time are input to the optical image comparison unit 612 from the position detection unit 640. As a result of the comparison, in the case of detecting a defect, position coordinates of defect portions are calculated, and a defect location is recorded by indicating the coordinates correlated to a mark referenced from an optical image of the mask M and the defect location. Herein, one of alignment marks disposed at four corners of an inspection region on the mask M and used in a plate rotation alignment is preferably defined for use as a reference mark. A review screen by the reviewing unit 680 also displays coordinates correlating from the reference mark.

Next, the control computer 650 create a first map of the mask M based on the first comparison and a second map of the mask M based on the second comparison by using the map creation unit 660 (S16). Either of the first map or the second map may be created.

Next, a control computer stores either or both of the first map and the second map in the map storage unit 631 (S18).

Next, the fourth determination unit 629 or an operator determines necessity of defect correction of the mask M based on the first optical image, the first reference image, the second optical image, the second reference image, the first comparison, the second comparison, the first map, and the second map (S20). The determination may be based on one of the first optical image, the first reference image, the second optical image, the second reference image, the first comparison, the second comparison, the first map, and the second map. An example of a determination method based on the first comparison herein includes a method for determining the necessity based on a difference between an amount of the transmitted light in a pattern portion of the first optical image and an amount of the transmitted light in a pattern portion of the corresponding first reference image. Further, an example of a determination method based on the second comparison herein includes a method for determining the necessity based on a difference between an amount of the reflected light in a pattern portion of the second optical image and an amount of the reflected light in a pattern portion of the corresponding second reference image. Further, an example of a determination method based on the first map or the second map includes a method for determining the necessity based on a comparison between position deviation or a line width error on the first map or the second map and a predetermined error. In the present embodiment, the mask M includes the white defect I. Therefore, in a case where a line width error associated with the white defect I is larger than a predetermined error, it is determined that defect correction is needed in the first comparison and the first map, and also determined that defect correction is needed in the second comparison and the second map. A determination method is not limited to the above methods.

Next, the second determination unit 626 or an operator determines a defect type of a defect of the mask M determined that defect correction is needed (S22). Defect type information of the defect on the determined defect type is stored in the third storage unit 636 (S24). Herein, the defect type information of the defect is information indicating a defect type of the mask M and, for example, includes whether a defect is in a pattern form or in a pattern line width, or the defect is a pattern position deviation. Further, the information may include whether a defect is found in an optical image formed by the reflected light, or a defect is found in an optical image formed by the transmitted light. A defect type of the defect according to the present embodiment is a white defect, and the defect type information on the defect is information that "a defect is a white defect".

A defect correction method for the defect is determined by the third determination unit 628 or an operator (S26). Defect correction method information of the defect on the determined defect correction method is stored in the first storage unit 632 (S28). Herein, the defect correction method information includes information on a method for correcting a defect determined that the correction is needed. Examples of a defect correction method herein include: a defect correction method to reduce a transmittance of a substrate by melting a part of the substrate near the shielding film F by femtosecond laser pulse or the like; a defect correction method to increase a transmittance of the substrate by reducing a film thickness of the substrate; a defect correction method to remove an excessive shielding film F by a laser light or a focused ion beam (FIB); a defect correction method to remove the excessive shielding film F by FIB or an electron beam by making a part of the mask M locally into a corrosive gas atmosphere; a defect correction method to remove the excessive shielding film F by a cutting edge of an AFM cantilever; a defect correction method to deposit a metal film by a laser chemical vapor deposition (laser CVD); and a defect correction method to deposit an amorphous carbon film by an FIB or an electron beam. A correction method according to the present embodiment is a method for reducing a transmittance of a substrate. Defect correction method information according to the embodiment includes information on the defect correction method to reduce a transmittance of the substrate.

Next, a fourth determination unit 629 or an operator creates a coordinate list of a corrected portion, which includes coordinates of the mask M necessary for a correction, and the fourth storage unit 638 stores the list.

The coordinate list of a corrected portion, the defect type information, and the defect correction method information are sent to a correction apparatus 2000 through an interface 800. The correction apparatus 2000 corrects a defect of the mask M by using the coordinate list of a corrected portion, the defect type information, and the defect correction method information (S30).

Next, the control computer 650 irradiates the mask M with a lighting light by using the lighting unit 400 (S32). Then, the control computer 650 obtains, by using the imaging unit 500, a third optical image formed by the lighting light transmitted through the mask M and a fourth optical image formed by the lighting light reflected by the mask M (S34). Either of the third optical image or the fourth optical image may be obtained. The obtained third and fourth optical images are sent to the optical image comparison unit 612.

Next, by using the optical image comparison unit 612 and, for example, based on the coordinate list of a corrected portion, the defect type information, and the defect correction method information, the control computer 650 performs a third comparison between a first reference image and the third optical image and a fourth comparison between a second reference image and the fourth optical image (S36). One of the comparison between the first reference image and the third optical image and the comparison between the second reference image and the fourth optical image may be performed. When the first reference image and the second reference image are created, the correction portion coordinate list stored in the fourth storage unit 638 is used, and reference images on and around the coordinates of a corrected defect may be created.

Either or both of the third optical image and the first reference image and the fourth optical image and the second reference image are sent to the reviewing unit 680 and reviewed by an operator.

Next, the control computer 650 creates a third map of the mask M based on the third comparison and a fourth map of the mask M based on the fourth comparison by using the map creation unit 660 (S38). Either of the third map or the fourth map may be created.

Next, by using the map comparison unit 614 and, for example, based on the defect type information and the defect correction method information, the control computer 650 performs a fifth comparison between the first map and the third map and a sixth comparison between the second map and the fourth map (S40). The comparison may be either of the fifth comparison or the sixth comparison.

In the present embodiment, the defect type information includes information that "a defect is a white defect", and the defect correction method information includes information on "a defect correction method to reduce a transmittance of a substrate". The control computer 650 performs the fifth comparison and the sixth comparison on the coordinates of a corrected portion by using the map comparison unit 614.

Next, the first determination unit (determination unit) 624 or an operator determines, based on results of the fifth comparison and the sixth comparison, the defect type information, and the defect correction method information, whether correction is appropriate (S42). In the present embodiment, a form of the shielding film F is not changed. Therefore, the second map and the fourth map are not changed before and after correction. A portion including a larger error than a predetermined error in the second map includes a larger error than a predetermined error in the fourth map. On the other hand, if the correction is appropriate, a portion including a larger error than a predetermined error in the first map has a smaller error than a predetermined error in the third map. In the present embodiment, a correction is determined to be appropriate if a portion including a larger error than a predetermined error in the first map has a smaller error than a predetermined error in the third map in the fifth comparison, and a portion including a larger error than a predetermined error in the second map has a larger error than a predetermined error in the fourth map in the sixth comparison.

Next, an effect of the present embodiment will be described.

In a defect correction, even if a defect is seemingly corrected appropriately in a local view, there can be a case where another correction might be rather appropriate in a wider view. For example, even if position deviation of a pattern within a specific range on the mask M is seemingly corrected appropriately by moving the deviation on a left side of the mask M in a local view, there can be a case where the position deviation of the pattern should be moved on an upper side of the mask M in a wider view. To consider a way to appropriately correct a defect in such a case, not only a comparison between an optical image and a reference image, but also map comparison before and after correction is effective. The inspection apparatus according to the present embodiment includes the map storage unit 631, and therefore enables the map comparison.

In addition, a way of correction and a way of exposure can be changed by comparing a map before and after correction and feeding back an appropriate correction way to a correction apparatus and an exposure apparatus.

Further, a form of the shielding film F is not changed by the correction in which a transmittance of a substrate is changed according to the present embodiment. Therefore, a remarkable change is not detected even by comparing the second map and the fourth map, and both of the second map and the fourth map have a larger error than a predetermined error. Accordingly, if appropriateness of the correction is determined without using the defect type information and the defect correction method information, it is determined that the correction has been improperly performed, and a defect might be excessively detected. As in the present embodiment, if appropriateness of correction is determined based on the defect type information and the defect correction method information, excessive detection of a defect is prevented and the appropriateness of the correction can be properly determined.

In addition, when the defect type information is used, a reference image desirable to create a map in which a defect is supposedly detected in the third and fourth maps can be expanded by using the pattern generation unit 622. Accordingly, a time desirable for creating a reference image is reduced, and the mask M can be quickly inspected.

Further, when image alignments of an optical image and a reference image are matched to compare the optical image and the reference image in a process to detect a defect, a defective portion is not used to match the image alignment by using the defect type information and the coordinate list of a corrected portion. Thus, an optical image and a reference image can be more strictly compared. Especially, in a case where a line width is drastically widened or narrowed at a defective portion, image alignments are more precisely matched. As a result, map creation accuracy is improved.

Further, when the defect type information is used, an optical image corresponding to a lighting light determined to be defective in the first optical image and the second optical image is compared with a reference image by using the optical image comparison unit 612. In this manner, the mask M can be quickly inspected. Further, if information whether a defect is in a pattern form, in a line width of a pattern, or position deviation of a pattern is input to the optical image comparison unit 612, an inspection procedure of the mask M can be omitted. Therefore, the mask M can be effectively inspected.

In the correction method performed in the embodiment, a material of a shielding film used in correction does not remain on the mask M as a fragment, unlike a method for removing an excessive pattern by spattering by an FIB, a method for depositing a metal film by a laser CVD, and a method for depositing an amorphous carbon film as a pattern by the FIB or an electron beam. Therefore, it is sufficient that a map is compared within a predetermined dimensional range around a coordinate portion determined to be defective. In this manner, the mask M can be efficiently inspected. The above predetermined size range is, for example, about 10 µm to 1 mm, and can be properly set in accordance with a correction scale.

As described above, according to an inspection apparatus and an inspection method according to the present embodiment, an inspection apparatus and an inspection method can be provided which can highly accurately inspect a mask in which a defect has been corrected so as to increase the position accuracy and the line width dimensional accuracy of a pattern of a photolithography mask.

Second Embodiment

An inspection apparatus according to a second embodiment differs from the inspection apparatus according to the first embodiment in respect of further including a transfer image creation unit configured to create a transfer image based on a first optical image, a second optical image, a third optical image, or a fourth optical image, and a transfer parameter. The description of a point described in the first embodiment will be omitted herein.

Figure 7:
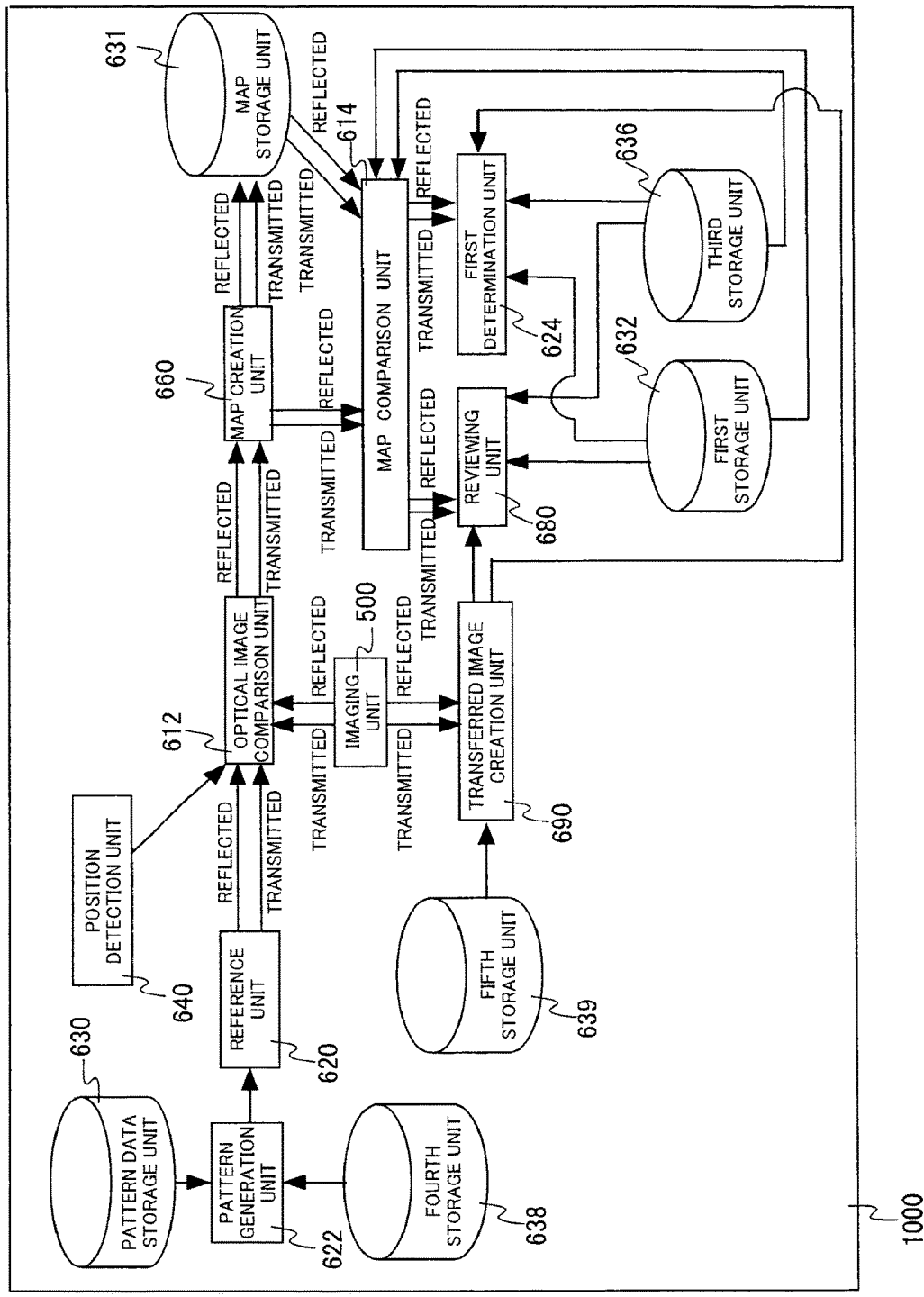
FIG. 7 is a schematic view of a main portion of an apparatus for inspecting a mask having a corrected defect according to a second embodiment.

FIG. 7 is a schematic view of an apparatus for inspecting a mask having a corrected defect according to the embodiment.

Examples of a transfer parameter stored in a fifth storage unit 639 include a type of a light source used for exposure such as a point source light and a dipole light source, a wavelength used for exposure, a number of openings of a lens used for exposure.

The transfer image creation unit 690 creates a transfer image in the case of transferring a mask on a wafer if the mask has a corrected defect, based on the above transfer parameter and an optical image obtained by the imaging unit 500. The created transfer image is used for reviewing by a reviewing unit 680. Further, a created transfer image is used to determine appropriateness of correction by a first determination unit 624.

In the present embodiment, a transfer image supposed to be transferred on a wafer enables confirming whether a defect is sufficiently corrected. Accordingly, the propriety of correction can be specifically determined, and yield of the correction of a mask M can be improved.

Further, since a transfer image in which an exposure condition is locally changed in a portion having position deviation of a pattern and a line width error can be confirmed, correction yield of the mask M can be improved.

As described above, according to an inspection apparatus according to the present embodiment, an inspection apparatus and an inspection method can be provided which can highly accurately inspect a mask in which a defect has been corrected so as to increase the position accuracy and the line width dimensional accuracy of a pattern of a photolithography mask.

Third Embodiment

An inspection apparatus according to a third embodiment differs from inspection apparatuses according to the first and second embodiments in respect of further including a second storage unit configured to store sensitivity specification data used in an optical image comparison unit or a map comparison unit. The descriptions of points described in the first and second embodiments will be omitted herein.

Figure 8:
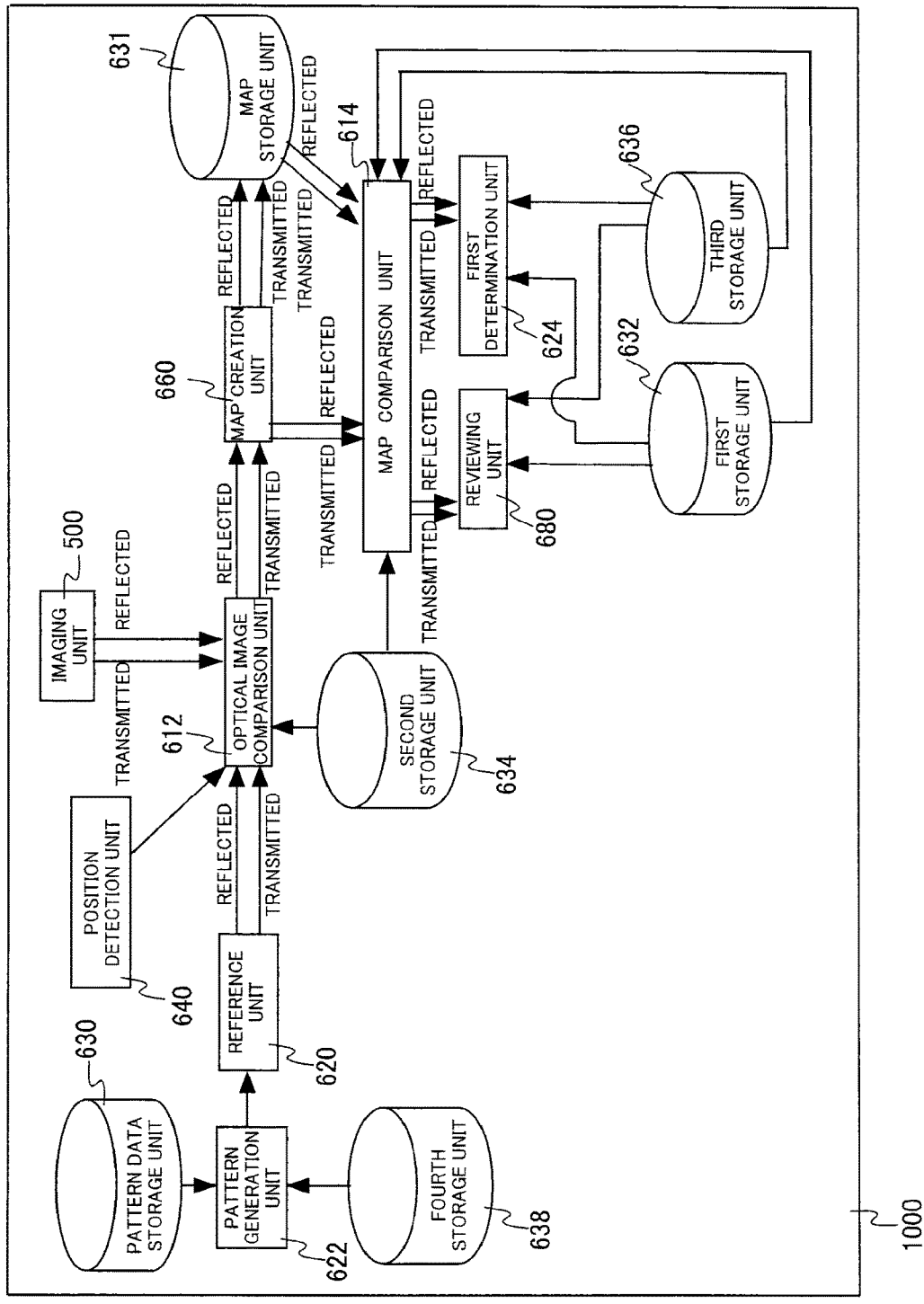
FIG. 8 is a schematic view of a main portion of an apparatus for inspecting a mask having a corrected defect according to a third embodiment.

FIG. 8 is a schematic view of a main portion of an apparatus for inspecting a mask having a corrected defect according to the third embodiment.

A defect in a pattern which is not transferred on a wafer such as an assist bar and a defect in a dummy pattern for uniformly performing chemical mechanical polishing (CMP) may not be strictly determined in comparison with a defect in a pattern of a transistor or the like transferred on a wafer. Sensitivity specification data in portions in which the assist bar and the dummy pattern are disposed is determined so as to lower a sensitivity of defect determination. In this manner, yield of the mask M can be improved.

Further, there is a case where a defect in a pattern form still remains although a defect in a line width and point deviation in a pattern have been corrected by the inspection apparatus according to the present embodiment. In this case, the form defect can be strictly determined by determining sensitivity specification data so as to increase a sensitivity of a defect determination.

According to an inspection apparatus according to the present embodiment, an inspection apparatus and an inspection method can be provided which can highly accurately inspect a mask in which a defect has been corrected so as to increase the position accuracy and the line width dimensional accuracy of a pattern of a photolithography mask.

As described above, an inspection apparatus according to the embodiment includes a lighting unit, an imaging unit, an optical image comparison unit, a map creation unit, a map storage unit, a first storage unit, a map comparison unit, and a determination unit. The lighting unit irradiates a sample including a defect to be inspected with a lighting light. The imaging unit obtains either or both of a first optical image formed by the lighting light transmitted through the sample to be inspected and a second optical image formed by the lighting light reflected by the sample to be inspected and obtains either or both of a third optical image formed by the lighting light transmitted through the sample to be inspected and having a corrected defect and a fourth optical image formed by the lighting light reflected by the sample to be inspected and having a corrected defect. The optical image comparison unit performs either or both of a first comparison between a first reference image referenced from an optical image formed by the lighting light transmitted through the sample to be inspected and the first optical image and a second comparison between a second reference image referenced from an optical image formed by the lighting light reflected by the sample to be inspected and the second optical image and performs either or both of a third comparison between the first reference image and the third optical image and a fourth comparison between the second reference image and the fourth optical image. The map creation unit creates either or both of a first map of the sample to be inspected based on the first comparison and a second map of the sample to be inspected based on the second comparison and creates either or both of a third map of the sample to be inspected based on the third comparison and a fourth map of the sample to be inspected based on the fourth comparison. The map storage unit stores either or both of the first map and the second map. The first storage unit stores defect correction method information on the defect. The map comparison unit performs either or both of a fifth comparison between the first map and the third map based on the defect correction method information and a sixth comparison between the second map and the fourth map based on the defect correction method information. The determination unit determines, based on the defect correction method information and either or both of the fifth comparison and the sixth comparison, whether the correction is appropriate. Accordingly, an inspection apparatus and an inspection method can be provided which can precisely inspect a mask in which a defect is corrected so as to increase the positional accuracy and the line width dimensional accuracy of a pattern of a photolithography mask.

In the above description, process contents or operation contents of "the storage unit" can be included in a program operable in a computer. Alternatively, in addition to a program being software, the program may be performed by combining software and hardware. Alternatively, firmware may be combined. In addition, in a case where the contents are included in a program, the program is stored in a storage medium in a magnetic disc unit, a magnetic tape unit, a FD, a read-only memory (ROM), and a solid state drive (SSD), which are not illustrated.

The description regarding a portion which is not directly needed in a description of the present invention, such as a configuration, is omitted in the embodiments. However, a necessary configuration can be selected appropriately for use. Further, all of inspection apparatuses and inspection methods which include elements in the present invention and can be appropriately changed in design by a person skilled in the art are included in the scope of the present invention. The scope of the present invention is defined by the scope of claims and the equivalent scope thereof.

What is claimed is:

1. An inspection apparatus, comprising:
    a lighting source configured to irradiate a sample including a defect to be inspected with a lighting light;
    an imager configured to obtain both of a first optical image formed by the lighting light transmitted through the sample to be inspected and a second optical image formed by the lighting light reflected by the sample to be inspected and to obtain both of a third optical image formed by the lighting light transmitted through the sample to be inspected and having a corrected defect and a fourth optical image formed by the lighting light reflected by the sample to be inspected and having a corrected defect;
    an optical image comparison circuit configured to perform both of a first comparison between a first reference image referenced from an optical image formed by the lighting light transmitted through the sample to be inspected and the first optical image and a second comparison between a second reference image referenced from an optical image formed by the lighting light reflected by the sample to be inspected and the second optical image and to perform both of a third comparison between the first reference image and the third optical image and the fourth comparison between the second reference image and the fourth optical image;
    a map creation circuit configured to create both of a first map of the sample to be inspected based on the first comparison and a second map of the sample to be inspected based on the second comparison and to create both of a third map of the sample to be inspected based on the third comparison and a fourth map of the sample to be inspected based on the fourth comparison;
    a map storage memory configured to store both of the first map and the second map;
    a first storage memory configured to store defect correction method information on the defect that indicates what type of defect correction operation, from among plural different defect correction operations, is to be utilized to correct the defect, the plural different defect correction operations including i) defect correction operations to reduce or increase transmittance of a substrate, ii) a defect correction operation to remove an excess shielding film, iii) and a defect correction operation to deposit an amorphous carbon film;
    a second storage memory configured to store defect type information on the defect;
    a map comparison circuit configured to perform both of a fifth comparison between the first map and the third map based on the defect correction method information and the defect type information, and a sixth comparison between the second map and the fourth map based on the defect correction method information and the defect type information; and
    a first determination circuit configured to determine, based on the defect correction method information, the defect type information and results of both of the fifth comparison and the sixth comparison, whether the correction is appropriate,
    wherein the first determination circuit is further configured to determine whether the correction is appropriate when a portion having a larger error than a predetermined error on the first map has a smaller error than a predetermined error on the third map in the fifth comparison, and a portion having a larger error than a predetermined error on a second map has a larger error than a predetermined error on the fourth map in the sixth comparison.

2. The inspection apparatus according to claim 1, further comprising a transfer image creation circuit configured to create a transfer image based on the first optical image, the second optical image, the third optical image, or the fourth optical image, and a transfer parameter.

3. The inspection apparatus according to claim 1, further comprising a third storage memory configured to store sensitivity specification data used in the optical image comparison circuit or the map comparison circuit.

4. The inspection apparatus according to claim 1, wherein the map comparison circuit further compares the optical image and the reference image based on the defect type information.

5. The inspection apparatus according to claim 1, further comprising a second determination circuit configured to determine a defect type of the defect.

6. The inspection apparatus according to claim 1, further comprising a third determination circuit configured to determine a defect correction method for the defect.

7. An inspection method, comprising:
    irradiating a sample including a defect to be inspected with a lighting light;
    obtaining both of a first optical image formed by the lighting light transmitted through the sample to be inspected and a second optical image formed by the lighting light reflected by the sample to be inspected;
    performing both of a first comparison between a first reference image referenced from an optical image formed by the lighting light transmitted through the sample to be inspected and the first optical image and a second comparison between a second reference image referenced from an optical image formed by the lighting light reflected by the sample to be inspected and the second optical image;
    creating both of a first map of the sample to be inspected based on the first comparison and a second map of the sample to be inspected based on the second comparison;
    storing both of the first map and the second map;
    determining necessity of defect correction of the defect;
    determining a defect correction method for the defect;
    storing defect correction method information on the defect that indicates what type of defect correction operation, from among plural different defect correction operations, is to be utilized to correct the defect, the plural different defect correction operations including i) defect correction operations to reduce or increase transmittance of a substrate, ii) a defect correction operation to remove an excess shielding film, iii) and a defect correction operation to deposit an amorphous carbon film;
    correcting the defect by using the defect correction method;

irradiating the sample to be inspected with a lighting light;
obtaining both of a third optical image formed by the lighting light transmitted through the sample to be inspected and a fourth optical image formed by the lighting light reflected by the sample to be inspected;
performing both of a third comparison between the first reference image and the third optical image and a fourth comparison between the second reference image and the fourth optical image;
creating both of a third map of the sample to be inspected based on the third comparison and a fourth map of the sample to be inspected based on the fourth comparison;
performing both of a fifth comparison between the first map and the third map based on the defect correction method information and defect type information and a sixth comparison between the second map and the fourth map based on the defect correction method information and the defect type information; and
determining whether the correction is appropriate, based on the defect correction method information, the defect type information and both of results of the fifth comparison,
wherein the correction is determined to be appropriate when a portion having a larger error than a predetermined error on the first map has a smaller error than a predetermined error on the third map in the fifth comparison, and a portion having a larger error than a predetermined error on a second map has a larger error than a predetermined error on the fourth map in the sixth comparison.

8. The inspection method according to claim 7, wherein the sample to be inspected comprises a substrate, a shielding film disposed on the substrate,
the defect correction method is a method for reducing a transmittance of the substrate, the defect correction method information is information on a method for reducing a transmittance of the substrate, and
the correction is determined to be appropriate when a portion having a larger error than a predetermined error on the first map has a smaller error than a predetermined error on the third map in the fifth comparison, and a portion having a larger error than a predetermined error on a second map has a larger error than a predetermined error on the fourth map in the sixth comparison.

9. The inspection method according to claim 7, further comprising determining a defect type of the defect.

10. The inspection method according to claim 9, wherein the defect type is a white defect.

* * * * *